US012603657B2

(12) United States Patent
    Kota et al.

(10) Patent No.: US 12,603,657 B2
(45) Date of Patent: Apr. 14, 2026

(54) REDUCING NON-LINEARITY IN A DIGITAL-TO-TIME CONVERTER (DTC) DUE TO UNEQUAL SUCCESSIVE INPUT CODES SPECIFYING RESPECTIVE DELAYS

(71) Applicant: Shaoxing Yuanfang Semiconductor Co., Ltd., Shaoxing (CN)

(72) Inventors: Venkata Kalyan Kumar Kota, Bangalore (IN); Augusto Manuel Marques, Norwich (GB); Rakesh Kumar Gupta, Bangalore (IN); Raja Prabhu J, Bangalore (IN)

(73) Assignee: Shaoxing Yuanfang Semiconductor Co., Ltd., Shaoxing (CN)

( * ) Notice: Subject to any disclaimer, the term of this patent is extended or adjusted under 35 U.S.C. 154(b) by 57 days.

(21) Appl. No.: 18/829,352

(22) Filed: Sep. 10, 2024

(65) Prior Publication Data
    US 2025/0323661 A1      Oct. 16, 2025

(30) Foreign Application Priority Data
    Apr. 12, 2024    (IN) .............................. 202441029799

(51) Int. Cl.
    H03L 7/197      (2006.01)
    H03M 1/74       (2006.01)
    H03M 3/00       (2006.01)
    H04L 7/033      (2006.01)

(52) U.S. Cl.
    CPC .......... H03L 7/1976 (2013.01); H03M 1/745 (2013.01); H03M 3/358 (2013.01); H03M 3/50 (2013.01); H04L 7/0331 (2013.01)

(58) Field of Classification Search
    CPC ........ H03M 3/358; H03M 3/50; H03M 1/745; H04L 7/0331; H03L 7/1976
    See application file for complete search history.

(56) References Cited

U.S. PATENT DOCUMENTS

| | | | |
|---|---|---|---|
| 10,116,315 B1 * | 10/2018 | Zhuang | .................... H03B 1/02 |
| 10,659,065 B2 * | 5/2020 | Mayer | .................... H03L 7/093 |
| 10,895,850 B1 * | 1/2021 | Elkholy | ................ G04F 10/005 |
| 11,018,688 B1 | 5/2021 | Guo et al. | |
| 11,923,857 B1 | 3/2024 | Zhang et al. | |

(Continued)

OTHER PUBLICATIONS

Wanghua Wu, A 28-nm 75-fsrms Analog Fractional-N Sampling PLL With a Highly Linear DTC Incorporating Background DTC Gain Calibration and Reference Clock Duty Cycle Correction, 2019, 12 Pages, IEEE Journal of Solid-State Circuits.

(Continued)

*Primary Examiner* — Jaison Joseph
(74) *Attorney, Agent, or Firm* — IPHORIZONS PLLC; Narendra Reddy Thappeta

(57) ABSTRACT

A digital-to-time converter (DTC) of a fractional-n PLL contains a delay generator and a current-drawing block. The current drawn by the delay generator from the power supply contains: (A) a fixed component having a first current magnitude regardless of magnitude of a second code specifying the desired delay; and (B) a variable component having a magnitude determined only by magnitude of the second code. The current-drawing block draws correction-current from the power supply, whose magnitude is determined only by a complement of the second code.

20 Claims, 10 Drawing Sheets

(56)         References Cited

U.S. PATENT DOCUMENTS

| 2015/0055552 A1* | 2/2015 | Tarighat Mehrabani ................... |
| | | H03L 7/1974 |
| | | 370/328 |
| 2016/0373120 A1* | 12/2016 | Caffee ................... H03L 7/0891 |
| 2017/0244544 A1* | 8/2017 | Galton .................... H03L 7/193 |
| 2018/0269895 A1* | 9/2018 | Kim ....................... G04F 10/005 |
| 2019/0280698 A1* | 9/2019 | Kearney ............... H03L 7/0814 |
| 2020/0067514 A1* | 2/2020 | Galton ................. H03L 7/1974 |
| 2022/0278687 A1* | 9/2022 | Turner ................... G06F 1/022 |
| 2025/0323661 A1* | 10/2025 | Kota ..................... H03M 1/745 |

OTHER PUBLICATIONS

Salvatore Levantino, An Adaptive Pre-Distortion Technique to Mitigate the DTC Nonlinearity in Digital PLLs, Aug. 2014, 11 Pages, vol. 49—Issue No. 8, IEEE Journal of Solid-State Circuits.

Nereo Markulic, A DTC-Based Subsampling PLL Capable of Self-Calibrated Fractional Synthesis and Two-Point Modulation, 2016, 15 Pages, IEEE Journal of Solid-State Circuits.
Hanli Liu, A Sub-mW Fractional-N ADPLL With FOM of −246 dB for IoT Applications, Dec. 2018, 13 Pages, vol. 53—Issue No. 12, IEEE Journal of Solid-State Circuits.
Salvatore Levantino, Nonlinearity Cancellation in Digital PLLs, 2013, 8 Pages, IEEE.
Jiayoon Zhiyu Ru, A High-Linearity Digital-to-Time Converter Technique: Constant-Slope Charging, Jun. 2015, 12 Pages, vol. 50—Issue No. 6, IEEE Journal of Solid-State Circuits.
Eslam Helal, DTC Linearization via Mismatch-Noise Cancellation for Digital Fractional-N PLLs, Dec. 2022, 14 Pages, vol. 69—Issue No. 12, IEEE Transactions on Circuits and Systems—I: Regular Papers.
Peng Chen, A 31-μW, 148-fs Step, 9-bit Capacitor-DAC-Based Constant-Slope Digital-to-Time Converter in 28-nm CMOS, Sep. 2019, 11 Pages, IEEE Journal of Solid-State Circuits.

* cited by examiner

REDUCING NON-LINEARITY IN A DIGITAL-TO-TIME CONVERTER (DTC) DUE TO UNEQUAL SUCCESSIVE INPUT CODES SPECIFYING RESPECTIVE DELAYS

PRIORITY CLAIM

The instant patent application is related to and claims priority from the co-pending India provisional patent application entitled, "DTC Non-Linearity Suppression Methods", Serial No.: 202441029799, Filed: 12 Apr. 2024, which is incorporated in its entirety herewith to the extent not inconsistent with the description herein.

BACKGROUND

Technical Field

Embodiments of the present disclosure relate generally to digital-to-time converters (DTCs), and more specifically to reducing non-linearity in a DTC due to unequal successive input codes specifying respective delays.

Related Art

Digital-to-time converters (DTCs) are generally used to generate an output signal having a corresponding edge delayed from that of an input clock signal by a magnitude specified by an input code. DTCs find use in electronic devices such as fractional-N phase locked loops (PLLs), sampling oscilloscopes, direct digital frequency synthesis, etc., as is well known in the relevant arts.

The ideal transfer function for a DTC is a straight line, implying that the time delay changes linearly with corresponding changes in values of the input code. However, in certain real-world scenarios, the actual output delay may deviate from the ideal value, which is termed as non-linearity in the operation of the DTC.

One of the reasons for the non-linearity in a DTC is due to unequal successive input codes specifying respective delays, such as when a DTC is used in a fractional-N PLL, as is well known in the relevant arts. Such non-linearity may be unacceptable at least in some environments.

Aspects of the present disclosure are directed to reducing non-linearity in a DTC due to unequal successive input codes specifying respective delays.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 1:
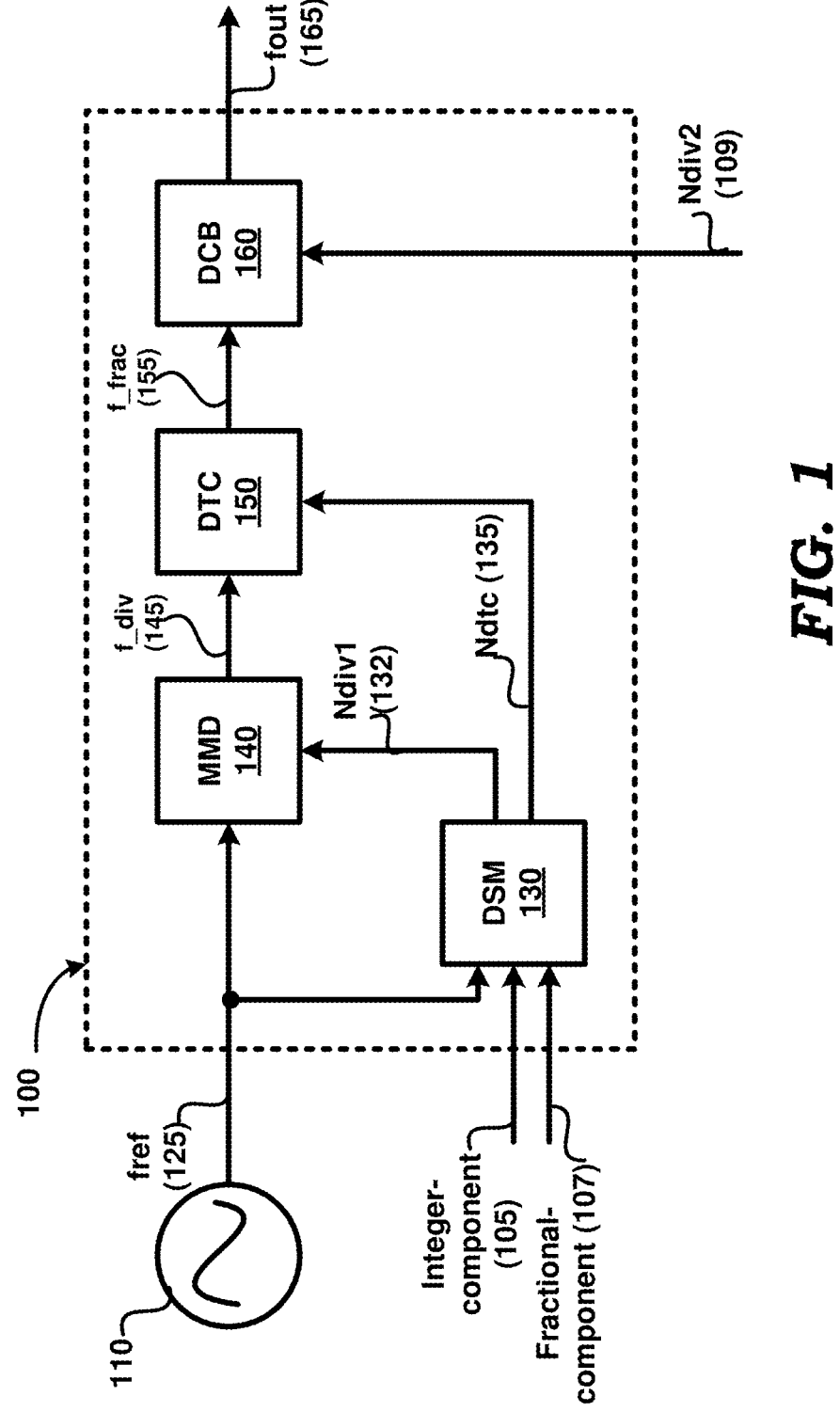
FIG. 1 is a block diagram of an example device in which several aspects of the present disclosure can be implemented.

An aspect of the present disclosure is directed to an open-loop modulator (OLM) circuit generating a fractional output clock having a frequency which is a desired fraction of that of a reference clock. The desired fraction contains an integer component and a fractional component. A delta-sigma modulator (DSM) of the OLM circuit generates a sequence of first codes and a corresponding sequence of second codes from the desired fraction, wherein the sequence of first codes contains a set of a lower value and a set of a higher value together representing the desired fraction on average.

A first divider coupled generates a divided signal having a period that is a multiple of the period of the reference clock from the reference clock and each first code of the sequence of first codes, and to, wherein the multiple is each first code. A digital-to-time converter (DTC) generates the fractional output clock from the divided signal, with the DTC containing a delay generator and a current-drawing block, which together operate to reduce non-linearity of the DTC.

The delay generators is powered by a power supply, and delays an edge of interest of the divided signal according to corresponding second code of the sequence of second codes to generate the fractional output clock, wherein the current drawn by the delay generator from the power supply contains: (A) a fixed component having a first current magnitude regardless of magnitude of the corresponding second code; and (B) a variable component having a magnitude determined only by magnitude of corresponding second code of the sequence of second codes.

The current-drawing block draws correction-current from the same power supply, whose magnitude is determined only by a complement of the corresponding second code of said sequence of second codes, wherein the current-drawing block operates to ensure that a sum of the correction-current and the variable component drawn by the delay generator is constant regardless of magnitude of the corresponding second code, and wherein total current drawn from the power supply by the delay generator and the current-drawing block equals an aggregate of the sum and the fixed component.

As a result, the total current drawn from the power supply by the delay generator and the current-drawing block together is constant, which improves the linearity of the DTC. The power efficiency also is enhanced since current-drawing block only complements the variable component in ensuring a constant aggregate.

In an embodiment, the current-drawing block is implemented as a current digital-to-analog converter (DAC) which receives the complement as input and draws the correction-current to convert the complement to current. According to another aspect, only a subset of bits of the complement are used as input to the DAC, for further area efficiency.

Several aspects of the present disclosure are described below with reference to examples for illustration. However, one skilled in the relevant art will recognize that the disclosure can be practiced without one or more of the specific details or with other methods, components, materials and so forth. In other instances, well known structures, materials, or operations are not shown in detail to avoid obscuring the features of the disclosure. Furthermore, the features/aspects described can be practiced in various combinations, though only some of the combinations are described herein for conciseness.

2. Example Device

FIG. 1 is a diagram illustrating the details of an example device in which several aspects of the present disclosure can be implemented. FIG. 1 depicts an open-loop-modulator (OLM) 100 (also known as Open Loop Fractional Divider or Fractional Frequency Divider) implemented according to aspects of the present disclosure. OLM 100 generates output clock fout on path 165 from reference clock fref received on path 125, and is shown containing delta-sigma modulator (DSM) 130, multi-modulus divider (MMD) 140, digital-to-time converter (DTC) 150 and duty cycle block (DCB) 160. It is noted herein that only components as relevant to the understanding of the disclosure are depicted in FIG. 1. It is understood that OLM 100 can contain more or fewer blocks than those shown in FIG. 1.

Reference clock fref (125) may be generated by a phase-locked loop (PLL), oscillator, etc. In an embodiment, PLL 110 generates reference clock fref (125) and can be implemented in a known way.

DSM 130 receives a desired 'fraction' ('divide value') in the form of integer-component 105 and fractional-component 107, and generates a sequence of correlated code pairs on Ndiv1 132 and Ndtc 135, in a known way. The first value of the pair is an integer and the second value of the pair indicates a desired delay, which in combination realizes the desired fractional output clock on fout 165. As an example, for a fraction 4.25 containing integer component of '4' and fractional component of '0.25, a (repetitive) sequence of digits 4, 4, 4, and 5 (averaging 4.25) are sent on Ndiv1 (132), while a sequence of delay values $\frac{1}{4}$, $\frac{2}{4}$, $\frac{3}{4}$ and 0 are sent on Ndtc (135). As described below, fout 165 (f_frac 155) is generated with a period of 4.25 times that of fref 125. dsm_carry 133 is at 1 when the higher values (5) are transmitted on Ndiv1 132 and at 0 otherwise. In an embodiment, DSM 130 is a first-order delta-sigma modulator. Although the illustrative embodiment depicts a first-order delta-sigma modulator, aspects of the present disclosure are equally applicable to delta-sigma modulators of higher order, as will be apparent to a skilled practitioner by reading the disclosure herein. DSM 130 can be implemented in a known way.

MMD 140 receives reference clock fref on path 125 and code Ndiv1 on path 132, and generates divided clock f_div on path 145 according to each received code Ndiv1 (132). Code Ndiv1 (132) contains a set of lower value (4 in the above example) and a set of higher value (5) resulting in corresponding lower and higher time periods of f_div (145)

such that the average period of f_div (145) equals the time period of desired fractional clock. MMD 140 can be implemented in a known way.

DTC 150 delays each falling (or rising) edge of divided clock f_div on path 145 by a magnitude represented by corresponding Ndtc code received on path 135 to generate fractional output clock f_frac on path 155. In the illustration, DTC 150 is shown as delaying falling edges of divided clock f_div (145). In general, particular 'edge of interest' (either rising edge or falling edge) is delayed by corresponding magnitude specified by code Ndtc on path 135, as is well known in the relevant arts.

Duty Cycle Block (DCB) 160 generates output clock fout on path 165 with a desired duty cycle corresponding to clock f_frac received on path 155. In an embodiment, DCB 160 operates as a divider block that divides frequency of f_frac (155) by an even number for obtaining the 50% duty cycle, and integer-component (105) and fractional-component (107) are accordingly scaled down. DCB 160 can be implemented in a known way.

Figure 2:
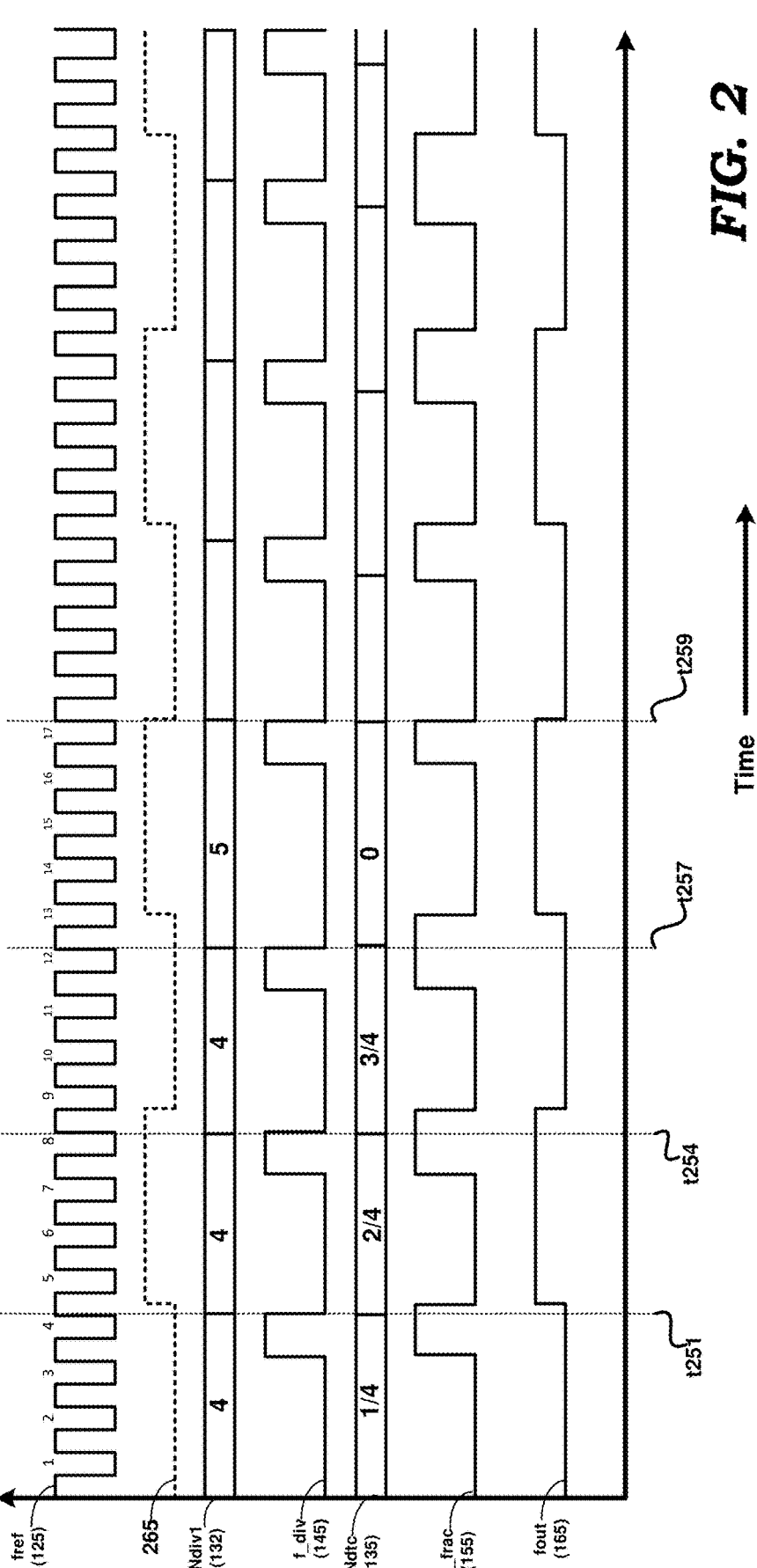
FIG. 2 is a timing diagram (not to scale) illustrating waveforms generated at various nodes of an open-loop-modulator (OLM).

FIG. 2 is a timing diagram (not to scale) illustrating waveforms generated at various nodes of OLM 100 assuming a fraction of 8.5 and that DCB 160 is designed to divide by 2. Thus, Ndiv1 132 is shown with a divisor equal to individual codes of repetitive sequence 4, 4, 4 and 5 respectively, and Ndtc 135 is shown with correlated codes of $\frac{1}{4}$, $\frac{2}{4}$, $\frac{3}{4}$ and 0. Signal f_div 145 represents the corresponding divided clock generated by dividing fref (125) with the codes received on Ndiv1 (132), with time period of f_div (145) corresponding to Ndiv1 (132) codes as depicted at time instances t251, t254, t257 and t259. Signal f_frac (155) depicts the falling edges of f_div (145) delayed by a magnitude specified by Ndtc 135. Signal fout 165 depicts the desired output signal with 50% duty cycle, obtained by dividing frequency of f_frac (155) by 2.

It may be appreciated that unequal successive codes Ndtc (135) specifying respective delays may contribute to non-linear behavior of DTC 150, as will be explained next with reference to implementation of a prior DTC. Accordingly, an example prior DTC is briefly described next with reference to FIGS. 3A-3D.

3. Prior DTC

Figure 3A:
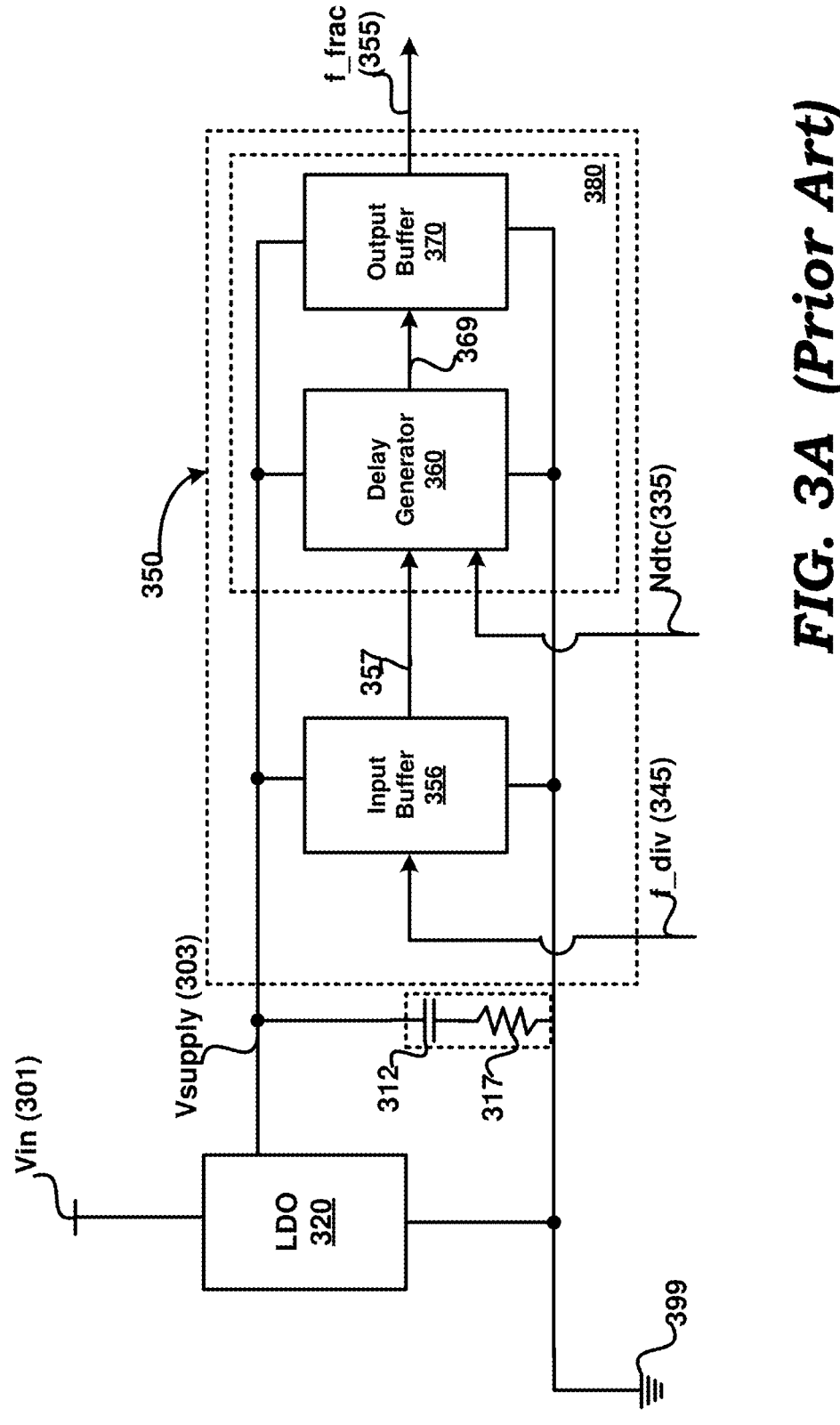
FIG. 3A is a block diagram illustrating the implementation details of a prior digital-to-time converter (DTC).

FIG. 3A is a block diagram of a prior DTC 350 along with associated power supply 320 illustrating a problem with that implementation. FIG. 3A is shown containing low-dropout voltage regulator (LDO) 320 supplying regulated voltage Vsupply (303) of a desired magnitude (hereinafter referred to as 'nominal magnitude') to prior DTC 350 from an input voltage Vin (301). Also shown in FIG. 3A are decoupling capacitor 312 and equivalent series resistance 317, associated with LDO 320. Node 399 represents ground providing constant reference potential.

DTC 350 is shown containing input buffer 356, delay generator 360 and output buffer 370. Delay generator 360 and output buffer 370 may together be viewed as 'delay control block' 380 designed to generate the desired fractional output clock.

Input buffer 356 generates high strength clock (full logic level digital signal) on path 357 from divided clock f_div received on path 345 for use within delay generator block 360. Thus, the frequency of output clock (357) of input buffer 356 with respect to clock f_div (345) remains unvaried.

Delay generator 360 generates the fractional output clock on path 369, which is delayed version of f_div 345 (equivalent of f-div 145 of FIG. 1), with the delays (of corresponding edges of f_div 345) being specified by the values of code Ndtc received on path 335. Output buffer 370 generates high strength fractional output clock on path f_frac (355) from fractional output clock received on path 369. The implementation details of blocks 356, 360 and 370 are described next with respect to FIG. 3B.

Figure 3B:
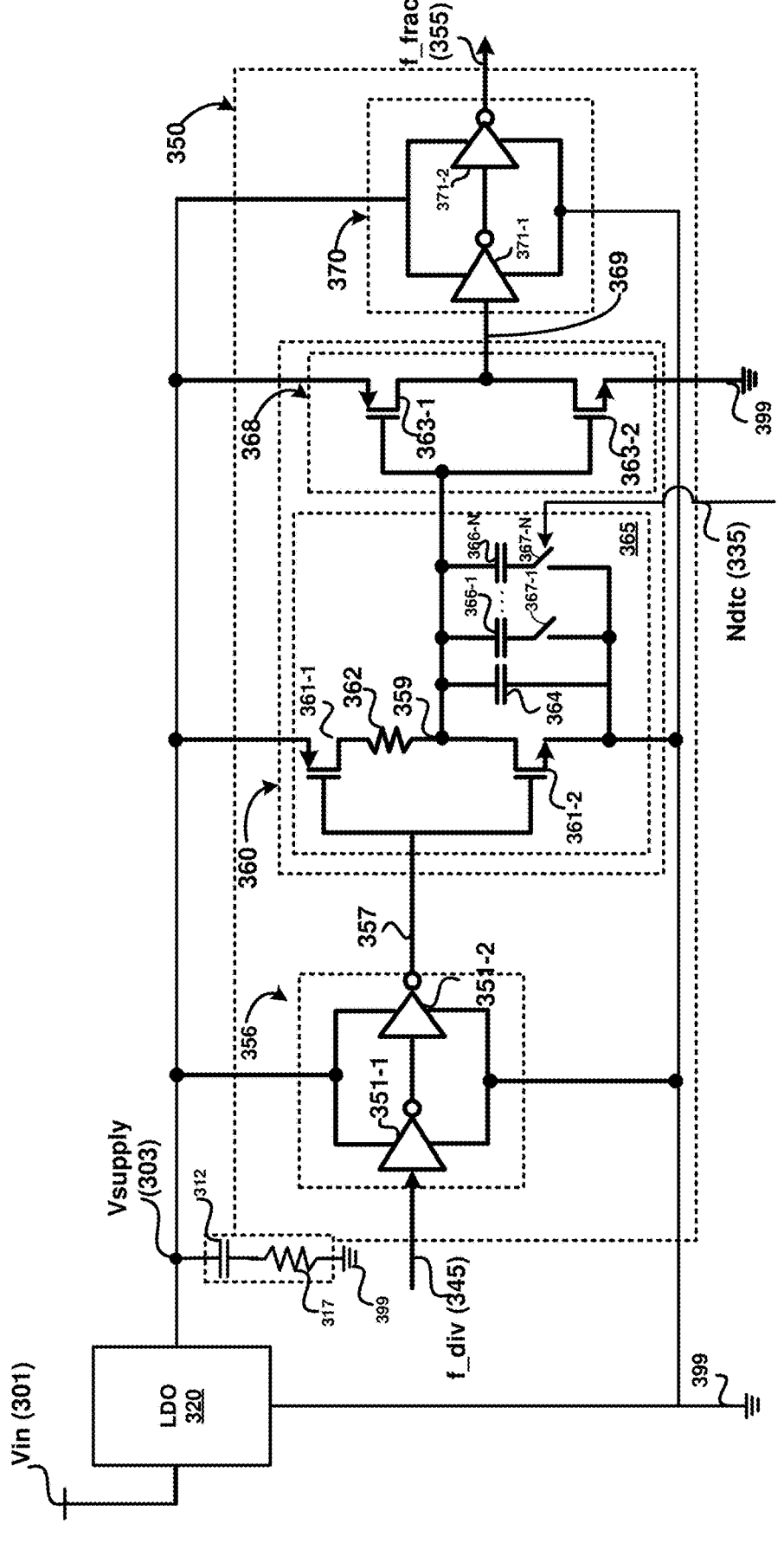
FIG. 3B is a block diagram illustrating further details of the prior DTC.

FIG. 3B depicts implementation details of prior DTC 350. Specifically, input buffer 356 is shown containing complementary metal-oxide semiconductor (CMOS) inverters 351-1 and 351-2. Output buffer 370 is shown containing CMOS inverters 371-1 and 371-2.

Delay generator 360 is shown containing asymmetric inverter 365 (comprising transistors 361-1, 361-2, resistor 362, fixed offset-capacitor 364 and capacitor bank containing capacitors 366-1 to 366-N) and symmetric inverter 368 (comprising transistors 363-1 and 363-2). Switches 367-1 to 367-N are used to either connect or disconnect the respective capacitor to/from asymmetric inverter 365.

Capacitors 366-1 through 366-N may be collectively or individually referred to below by respective numeral 366, as will be clear from the context. Also, switches 367-1 through 367-N may be collectively or individually referred to by numeral 367, as will also be clear from the context. Similar convention is followed for other blocks/components/signals throughout the disclosure.

When an all-zeroes code is received on path 335, delay provided by asymmetric inverter 365 is not zero but rather a fixed offset from zero. This is typically done to avoid non-linearity that may be caused due to delay going from all-zeroes code to a code that is not all-zeroes, for example, Ndtc code of '1'.

The difference between the delay when Ndtc code is '1' and the delay when Ndtc code is all-zeroes has been found to be greater than the difference between delays when Ndtc code equals '2' and Ndtc code equals '1', which in turn is found to be greater than the difference between delays when Ndtc code equals '3' and Ndtc code equals '2', and so on. Therefore, the fixed offset noted above is added in order to make the differences in delays in successive Ndtc codes negligible. Such fixed offset is realized by offset-capacitor 364. Thus, when Ndtc code is not all-zeroes, capacitor 364 in combination with selected capacitor 366, operates to realize the corresponding specified delay. When such non-linearity can be tolerated, offset-capacitor 364 may be omitted.

As is well known in the relevant arts, one or more of the capacitors (366) in capacitor bank are selected based on code Ndtc (335), and the RC time-constant of the RC circuit constituted of resistor R (362) and selected capacitor(s) (366) determines the slope of rising edge of clock signal at node 359. The switching threshold voltage of symmetric inverter is fixed and is designed to be close to the mid-way between Vsupply (303) and ground 399.

Delay generator 360 provides the desired delay, as specified by magnitude of code Ndtc (335), to the falling edge of signal f_div (345).

The charging current of selected capacitor(s) 366 may cause a corresponding dip in magnitude of voltage Vsupply at node 303, and therefore ripple in Vsupply (303). As noted above, the capacitance value(s) of selected capacitor(s) 366 is a function of code Ndtc (335) in order to realize the specified delay. Accordingly, the charging current (which depends on selected capacitor(s) 366) at occurrence of edges of f_div (345) is also a function of code Ndtc (335), resulting in dips in magnitude of Vsupply (303) proportional to code values Ndtc (335). Such ripple in Vsupply (303) manifests as non-linear behavior of DTC 350, as explained in detail with respect to FIG. 3C.

On the other hand, the current drawn from LDO 320 by symmetric inverter 368 and inverters 371-1 and 371-2 at occurrences of edges of f_div (345) is near to a constant value (substantially fixed magnitude), regardless of magnitude of Ndtc (335).

Thus, current drawn from LDO 320 may be considered to contain the following components:

A fixed component, representing currents drawn by symmetric inverter 368, offset-capacitor 364 (if present) and output buffer 370 (if present); and A variable component representing current drawn by components (other than offset-capacitor 364) contained in asymmetric inverter 365.

As noted above, the magnitude of variable component is determined only by magnitude of Ndtc code (335).

Figure 3C:
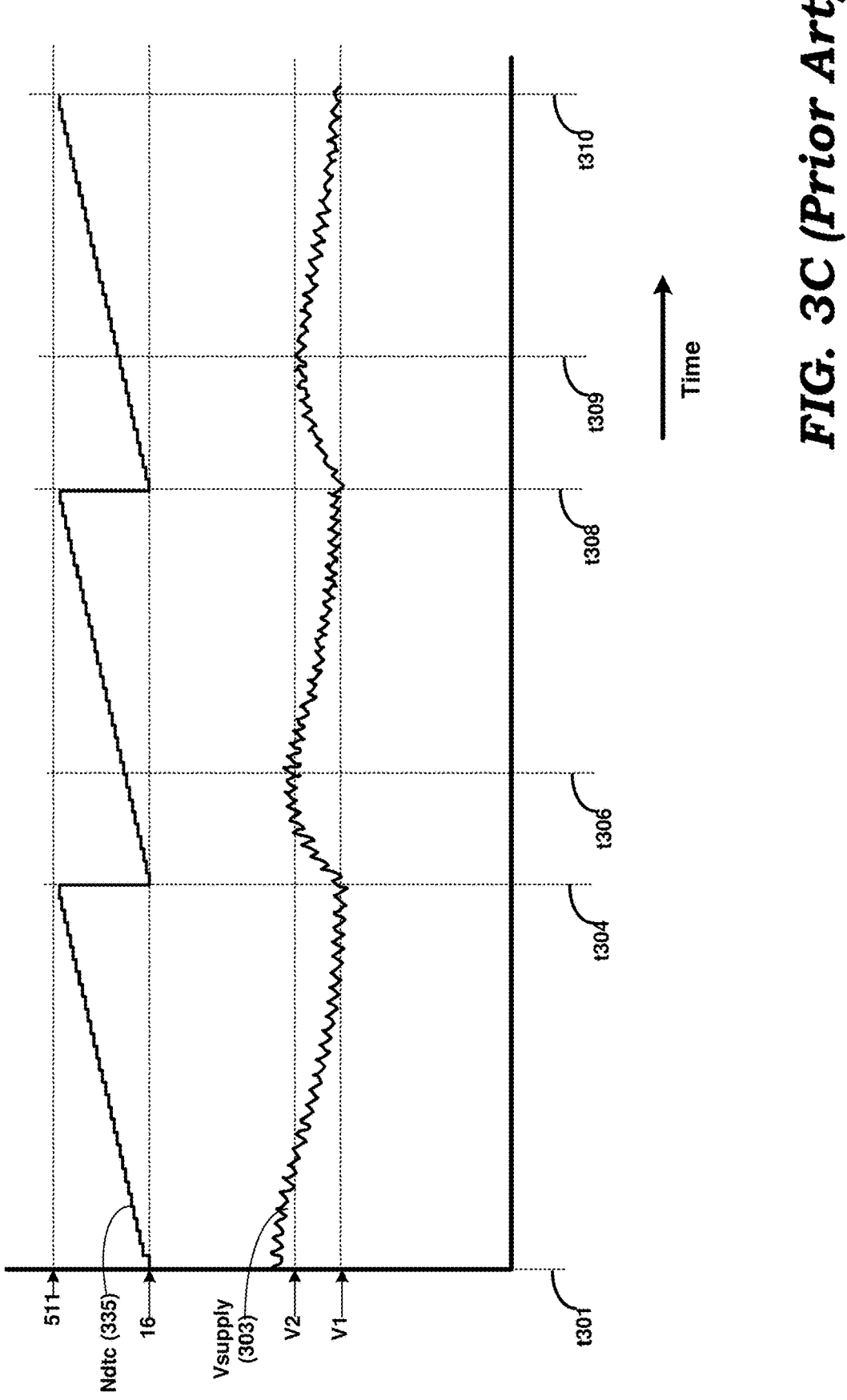
FIG. 3C is a timing diagram (not to scale) depicting the ripple in power supply voltage in the prior DTC.

FIG. 3C is a timing diagram (not to scale) illustrating ripple in power supply during steady-state operation (i.e., after the circuit settles in a short time after being powered on), of prior DTC 350, and depicts waveforms/values Vsupply (303) and Ndtc (335). Decimal values of code Ndtc (335) are shown for ease of understanding. Waveform Vsupply (303) is depicted for an example fractional-component of 16/512. Code Ndtc (335) is assumed to be 9 bits wide for the illustration.

It is noted herein that although FIG. 3A depicts LDO 320 as supplying regulated voltage to blocks 356 and 380, waveforms of FIG. 3C depict power supply ripple only due to delay control block 380, for the sake of simplicity.

Waveform Ndtc (335) follows saw-tooth cycles (as depicted in time intervals t301-t304, t304-t308 and t308-t310) due to operation of accumulator inside first-order DSM, as is well known in the relevant arts.

Vsupply (303) is shown varying between magnitudes V1 and V2 over the saw-tooth cycle of Ndtc (335). Largest change in magnitude of Vsupply (303) happens where there a biggest jump in the Ndtc (335) code (as depicted at time instants t304 and t308), ignoring the high-frequency (but smaller magnitude) ripple in Vsupply (303).

In time intervals t304-t306 and t308-t309, magnitude of Vsupply (303) is shown as being restored to around magnitude V2 due to operation of control-loop of LDO 320. In other words, since current drawn from LDO 320 is lesser in magnitude for smaller magnitudes of Ndtc (335), control-loop of LDO 320 is able to restore Vsupply (303) to magnitude V2.

However, as the magnitude of code Ndtc (335) increases, magnitude of Vsupply (303) gradually decreases with time, leading to larger ripple in Vsupply (303) (as depicted in time intervals t306-t308 and t309-t310). This may be due to limited bandwidth of LDO 320. For example, at least in some embodiments, frequency of signal f_div (345) may be much higher than the bandwidth of LDO 320.

The larger ripple (approximately V2 minus V1) on Vsupply (303), if left uncorrected, results in the magnitude of Vsupply (303) not being the same at occurrences of edges of signal f_div (345)/357. Accordingly, the code-dependent delay provided by asymmetric inverter 365 is not the ideal delay, thereby resulting in non-linear behavior of prior DTC 350, and causing an unacceptable jitter in signal f_frac (355) which manifests in output clock of OLM. The variable component of current noted above contributes completely or substantially to ripple (V2 minus V1).

Advantages of the present disclosure will become clearer when compared with a prior solution to reduce non-linearity in DTC. Accordingly, a prior solution is briefly described next.

4. Prior Solution

Figure 3D:
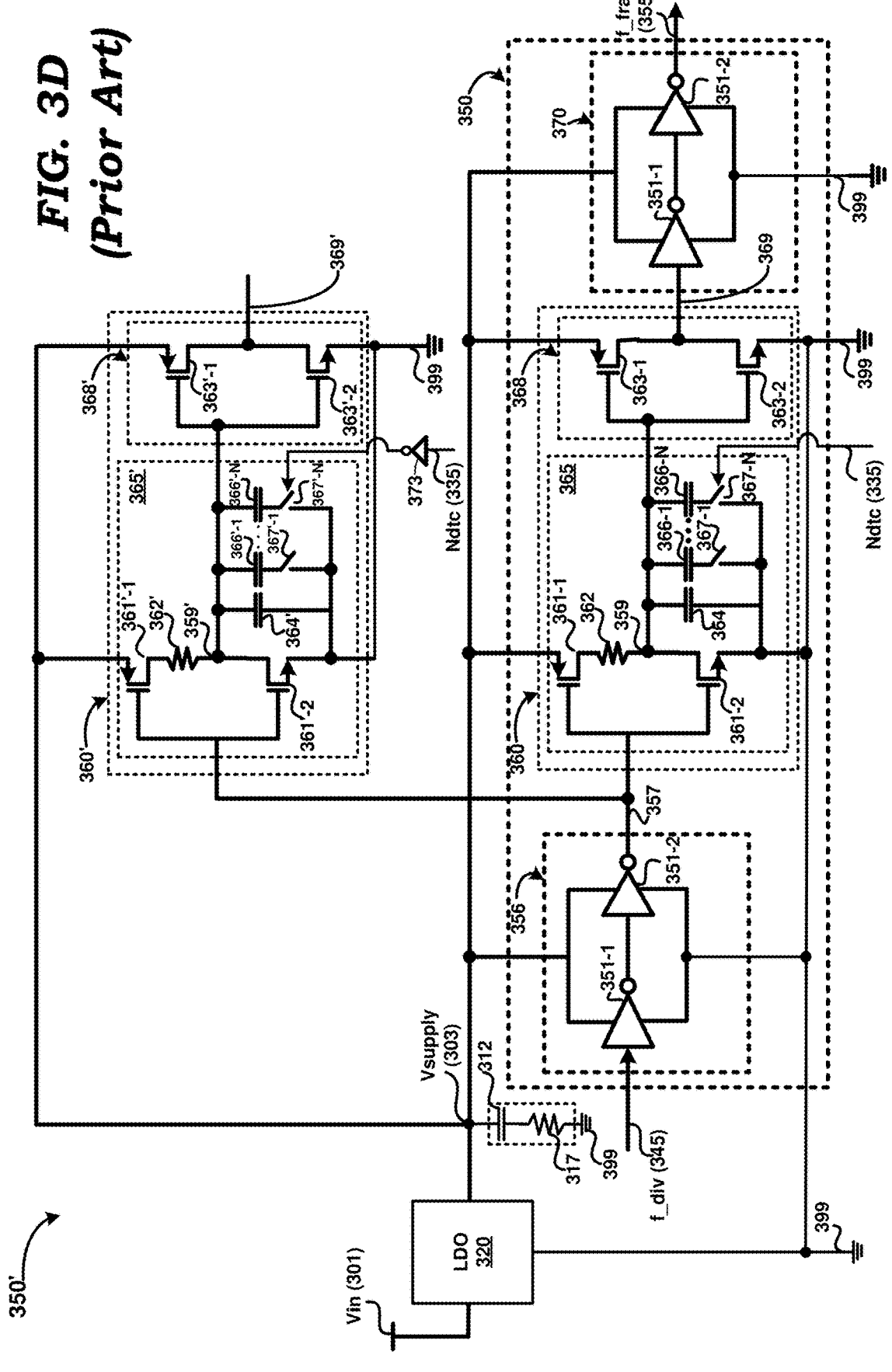
FIG. 3D is a diagram illustrating the manner in which ripple is reduced in the prior DTC.

FIG. 3D is a diagram depicting a prior technique to reduce non-linearity of prior DTC 350. DTC 350' corresponds to prior DTC 350 depicted in FIGS. 3A/3B, and is shown as additionally containing block 360', which is a replica of block 360. Block 360' is shown containing asymmetric inverter 365' and symmetric inverter 368'. Asymmetric inverter 365', in turn, is shown containing transistors 361'-1, 361'-2, resistor 362', offset-capacitor 364' and capacitor bank (containing capacitors 366'-1 to 366'-N) which is a replica of capacitor bank in asymmetric inverter 365. Symmetric inverter 368' in turn is shown containing transistors 363'-1 and 363'-2. Switches 367'-1 to 367'-N are used to either connect or disconnect the respective capacitor to/from asymmetric inverter 365'. Signal 369' is a dummy signal that may or may not be used further.

Asymmetric inverter 365' receives (1'*s*) complement of code Ndtc (335) (via inverter 373) on path 335'. One or more of the capacitors (366') in capacitor bank are selected based on complement of code Ndtc (335), so as to make the overall current drawn from LDO 320 substantially constant, thus reducing non-linearity in prior DTC 350'.

However, in the prior solution, the overall current drawn from LDO 320 by delay generator 360 and block 360' comprises:

(A) A fixed component consisting of:
  (i) Currents drawn by symmetric inverter 368 and offset-capacitor 364 (if present), and
  (ii) Currents drawn by symmetric inverter 368' and offset-capacitor 364' (if present); and (B) A variable component consisting of:
  (i) Current drawn due to operation of variable capacitor bank (excluding offset-capacitor 364) in asymmetric inverter 365, the magnitude of which is determined by magnitude of Ndtc code (335); and
  (ii) Current drawn due to operation of replica capacitor bank (excluding offset-capacitor 364') in asymmetric inverter 365', the magnitude of which is determined by magnitude of complement of Ndtc code (335).

Thus, while the prior technique may reduce non-linearity in prior DTC 350', the prior solution results in significant area overhead (primarily due to replica capacitor bank) as well as increased current consumption due to duplication of fixed current (fixed component (A) (ii) noted above).

Embodiments of the present disclosure overcome the problems noted above as described next.

5. Digital-to-Time Converter (DTC)

Figure 4:
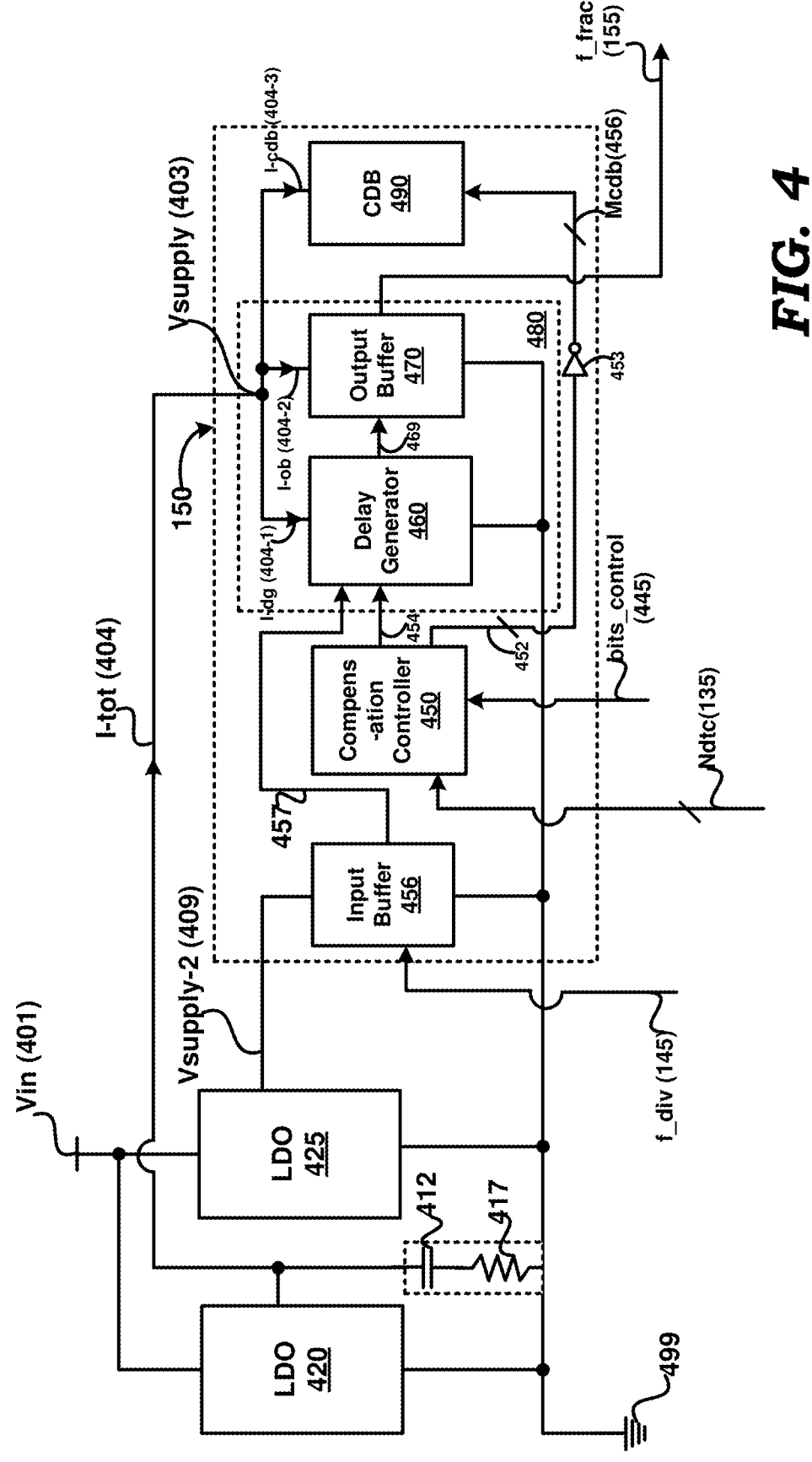
FIG. 4 is a diagram illustrating the implementation details of a DTC, in an embodiment of the present disclosure.

FIG. 4 is a block diagram of a DTC, along with associated power supplies LDO 420 and LDO 425, implemented according to the aspects of the present disclosure. DTC 150 in turn is shown containing input buffer 456, correction-controller (CC) 450, delay control block 480 and current-drawing block (CDB) 490. Delay control block 480, in turn, is shown containing delay generator 460 and output buffer 470. Also shown in FIG. 4 are decoupling capacitor 412 and equivalent series resistance 417, associated with LDO 420. Node 499 represents ground providing constant reference potential. It is noted herein that only components as relevant to the understanding of the disclosure are depicted in FIG.

4. It is understood that DTC 150 and associated power supplies LDO 420 and 425 can contain more or fewer blocks/components than those shown in FIG. 4.

Blocks 456, 460 and 470 are functionally equivalent to blocks 356, 360 and 370 respectively of FIG. 3A, and their description is not repeated here in the interest of brevity. Also, signals 457 and 469 are functionally equivalent to signals 357 and 369 respectively of FIG. 3A, and their description is not repeated here, also in the interest of brevity. Number of capacitors in capacitor bank and their magnitudes may be implemented in any suitable way. For example, capacitance values may all be the same, or related in unary, binary or other fashion. Ndtc (135) codes are generated to be consistent with the corresponding implementation.

Output buffer 470 may be omitted in some embodiments, in which case, signal 469 is forwarded as fractional clock 155.

LDO 425 operates to provide regulated supply voltage Vsupply-2 (409) from input voltage Vin received on path 401. LDO 420 operates to provide regulated supply voltage Vsupply (403) from input voltage Vin (401). Voltage Vin (401) represents a DC voltage source providing input voltage to LDOs 420/425.

Although the illustrative embodiment depicts power supply 420 implemented as an LDO, aspects of the present disclosure are equally applicable to any linear or switching voltage regulator supplying regulated voltage on path 403, as will be apparent to a skilled practitioner upon reading the disclosure herein.

CC 450 controls the input to CDB 490 so as to cause CDB 490 to complement the variable component of current drawn from power supply 420 to ensure constant current is drawn even for unequal magnitudes of code Ndtc (135). CC 450 forwards code Ndtc (135) to delay generator (460) on path 454. CC 450 extracts a number of most-significant bits (MSBs) from code Ndtc (135) as specified by input bits_control received on path 445, and provides the extracted MSBs on path 452. Inverter 453 operates to invert each bit received on path 452. Only a single inverter 453 is shown for the sake of simplicity. Thus, Mcdb (456) represents 1's complement of bits on path 452.

Bits_control 445 may be configured by a user via corresponding means, not shown. Alternatively, magnitude of bits_control 445 may be read from non-volatile memory of OLM 100 in a known way. In the illustrative embodiment, Ndtc (135) is 9 bits wide, and bits_control (452) equals 4. Thus, Mcdb (456) is 4 bits wide.

Each of currents 404-1, 404-2 and 404-3 represents the current drawn by respective block 460, 470 and 490 when the corresponding inverters inside the blocks switch states (i.e., at occurrences of edges of f_div 145). As noted above, current I-dg (404-1) comprises a fixed component and a variable component. Current I-ob (404-2) is of a fixed magnitude. Current drawn by CC 450 may be negligible compared to current drawn by blocks 480 and 490, and therefore is disregarded for the purpose of quantifying overall current drawn from LDO 420.

CDB 490 operates to draw (sink) current 404-3 (hereinafter correction-current) from power supply LDO 420 with a magnitude that is determined only by magnitude of input Mcdb received on path 456. In other words, CDB 490 does not draw any fixed current component from LDO 420 that is independent of magnitude of code Mcdb (456), contrasted with the fixed component (A) (ii) of the prior solution noted above. CDB 490 operates to ensure that a sum of correction-current and the variable component drawn by the asymmetric inverter contained in delay generator 460 is constant regardless of magnitude of Ndtc code (135). As an example, the larger the magnitude of 404-1, smaller will be magnitude of 404-3, and vice versa.

It is noted herein that even if a single LDO were to be employed to provide regulated voltage to blocks 456 and 480, CDB 490 would operate to minimize non-linearity contributed by delay control block 480 in comparison with prior art (FIG. 3A). Separate LDOs provide an added benefit of further reducing non-linearity caused due to additional contribution by input buffer 456.

The implementation details of CDB 490 in an embodiment of the present disclosure are provided next.

6. Current-Drawing Block

Figure 5:
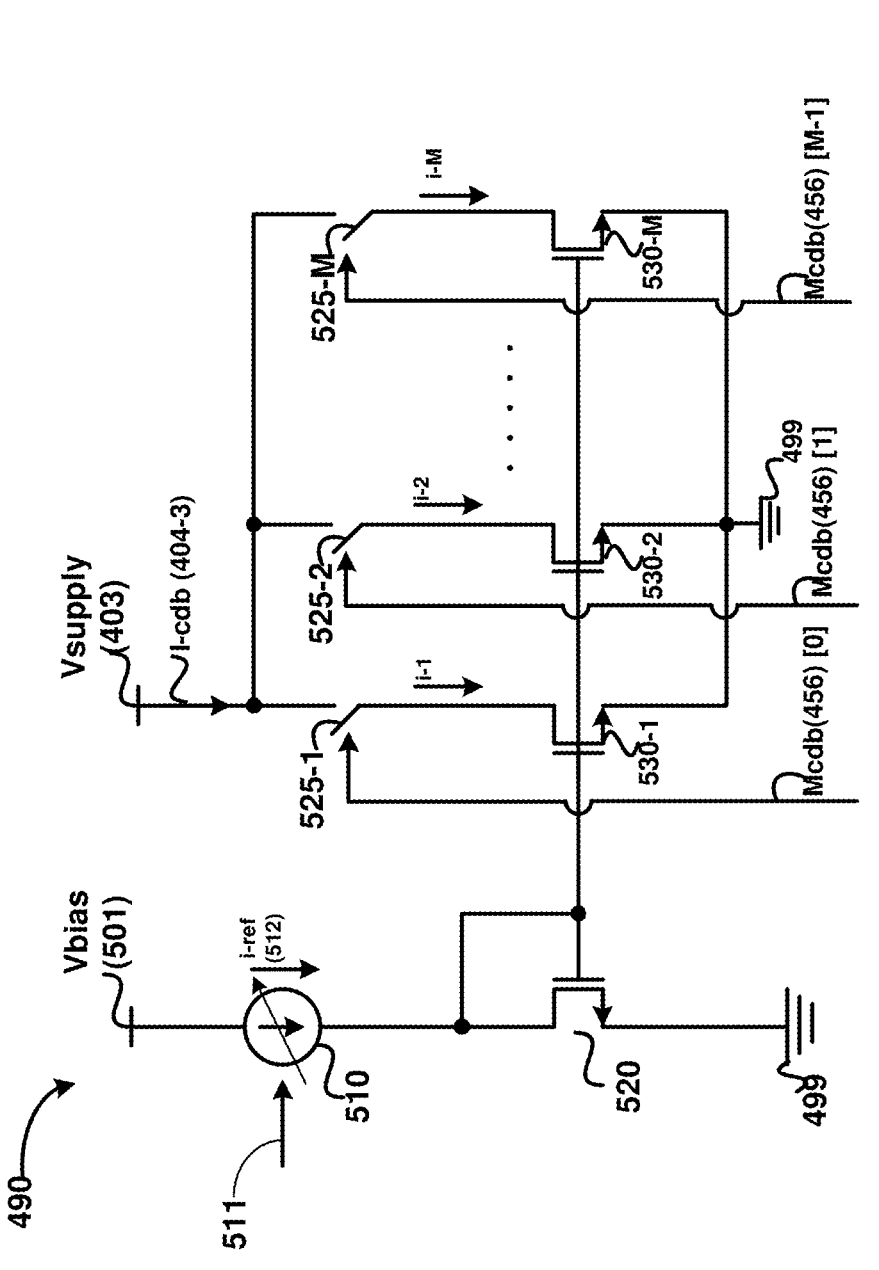
FIG. 5 is a diagram illustrating the implementation details of a current-drawing block, in an embodiment of the present disclosure.

FIG. 5 is a diagram illustrating the implementation details of CDB 490 in an embodiment of the present disclosure. CDB 490 is shown implemented as a programmable M-bit current digital-to-analog converter (DAC) designed to draw (sink) current based on logic values of 'M' bits received on path 456. DAC 490 is shown containing transistors 520, 530-1 through 530-M, switches 525-1 through 525-M and programmable current source 510 sourcing current of magnitude i-ref. Node 499 represents ground providing constant reference potential. It is noted herein that only components as relevant to the understanding of the disclosure are depicted in FIG. 5. It is understood that DAC 490 can contain more or fewer blocks than those shown in FIG. 5. Vbias (501) represents bias voltage for current source 510, and may be generated internal to OLM 100 by a power supply other than LDO 420. Magnitude of current i-ref (512) sourced by programmable current source 510 is controlled by configuration-input 511.

In an embodiment, the number of transistors (M) equals the value specified on path 445 (bits_control). It is noted herein that dimensions (channel width and channel length values) of transistors 530-1 to 530-M may be related to each other in a way the capacitance values of capacitors in capacitor bank are related. For example, if the capacitance values are related to each other in a binary fashion, then the dimensions of transistors 530-1 to 530-M are also binary-weighted. At the very least, dimensions of the transistors may be related such that current drawn by CDB 490 is inversely related to variable current component drawn by delay generator 460, irrespective of the exact nature of the proportion.

Each switch 525 connects (disconnects) respective transistor 530 with (from) Vsupply (403), thereby turning the respective transistor on (off). Each switch is controlled to be open or closed by logic level of respective bit Mcdb (456). Thus, opening and closing of switch 525-1 is shown controlled by Mcdb (456) [0]. In an embodiment, switch 525 is closed when respective bit of Mcdb (456) is logic high, and open otherwise. When switch 525-1 is closed, transistor 530-1 draws a current whose magnitude is proportional to i-ref, with the proportionality based on the specific implementation of DAC 490.

The magnitude of current sourced by programmable current source 510 is configured so as to obtain the desired values of currents I-1 through I-M. Such configuration of programmable current source 510 may be designed for a certain operating frequency range of f_frac (155).

OLM 100 generally needs to be designed to support certain operating frequency ranges of clock f_frac (155), as is well known in the relevant arts. In an embodiment, current drawn by delay generator 460 is measured by simulating steady-state operation of delay generator 460 for each operating frequency range of f_frac (155) supported by OLM 100. The corresponding magnitudes of i-ref (512), taking into account process corners of the integrated circuit (IC) and calibration of DAC 490, is stored in a look-up table (LUT) for each range of _frac (155).

For example, assuming that configuration-input (511) to control source 510 is 4 bits wide, the entire operating frequency range of clock f_frac (155) is sub-divided into 16 ranges, and one of 16 possible values of i-ref (512) may be configured to be sourced by current source 510, depending on the desired operating frequency range of clock f_frac (155).

The LUT may be stored in non-volatile memory of OLM 100. Configuration-input (511) corresponding to the operating frequency range of f_frac (155) may be provided to current source 510 in a known way. For example, upon power-up of OLM 100, a first logic circuit of OLM 100 may determine the appropriate configuration-input value and store the value in a register, which in turn is read by a second logic circuit (e.g., contained in CC 450) of OLM 100 to configure CDB 490. Alternatively, a user may determine value of configuration-input (511) by looking up the LUT, and program a register with the appropriate configuration-input value via corresponding means.

Although the illustrative embodiment depicts using 4 MSBs of Ndtc (135) for operating CDB 490, in general, when an N-bit DTC is used, all bits or only some of the MSBs of the 'N' bits can be used to control the operation of CDB 490, as will be apparent to a skilled practitioner. Also, a fewer number of MSBs (e.g., 4 out of 9 bits in the illustrative embodiment) may reduce the programming complexity as well as simplify the implementation of CDB 490, while at the same time adequately complementing for the variable current component drawn from LDO 420.

It may be appreciated that the technique of using DAC noted above provides a solution that may not be sensitive to small variations (e.g., +/−10% change) in programmed DAC current, and therefore a coarse calibration of DAC may be sufficient to achieve the targeted jitter performance Also, although CDB 490 in the illustrative embodiment is shown implemented as a current DAC, aspects of the present disclosure can be equally well applied when alternative techniques (and/or alternative implementations of current DAC) are employed to sink current from LDO 420, as will be apparent to a skilled practitioner by reading the disclosure herein.

For example, different or more complex current-drawing blocks (circuits) can be employed for complementing the variable component noted above. Also, although the illustrative embodiment depicts first-order DSM, aspects of the present disclosure can be equally well applied to higher-order DSMs with corresponding changes to DTC and/or CDB circuitry, as will be apparent to a skilled practitioner by reading the disclosure herein.

Specifically, when variation in power supply has a non-linear relation (e.g., quadratic or exponential dependence) with variation in magnitudes of Ndtc (135) code, a LUT may be employed to store corresponding mappings between such variations and the desired DAC response (e.g., in terms of current I-ref, Mcdb (456) codes, etc.).

Although the illustrative embodiment depicts a particular technique of determining and configuring the magnitude of i-ref (512), alternative embodiments may employ different techniques, as will be apparent to a skilled practitioner by reading the disclosure herein.

The description is continued to illustrate the manner in which CDB 490 reduces non-linearity in DTC 150 in accordance with aspects of the present disclosure.

7. Reducing Non-Linearity in DTC

Figure 6:
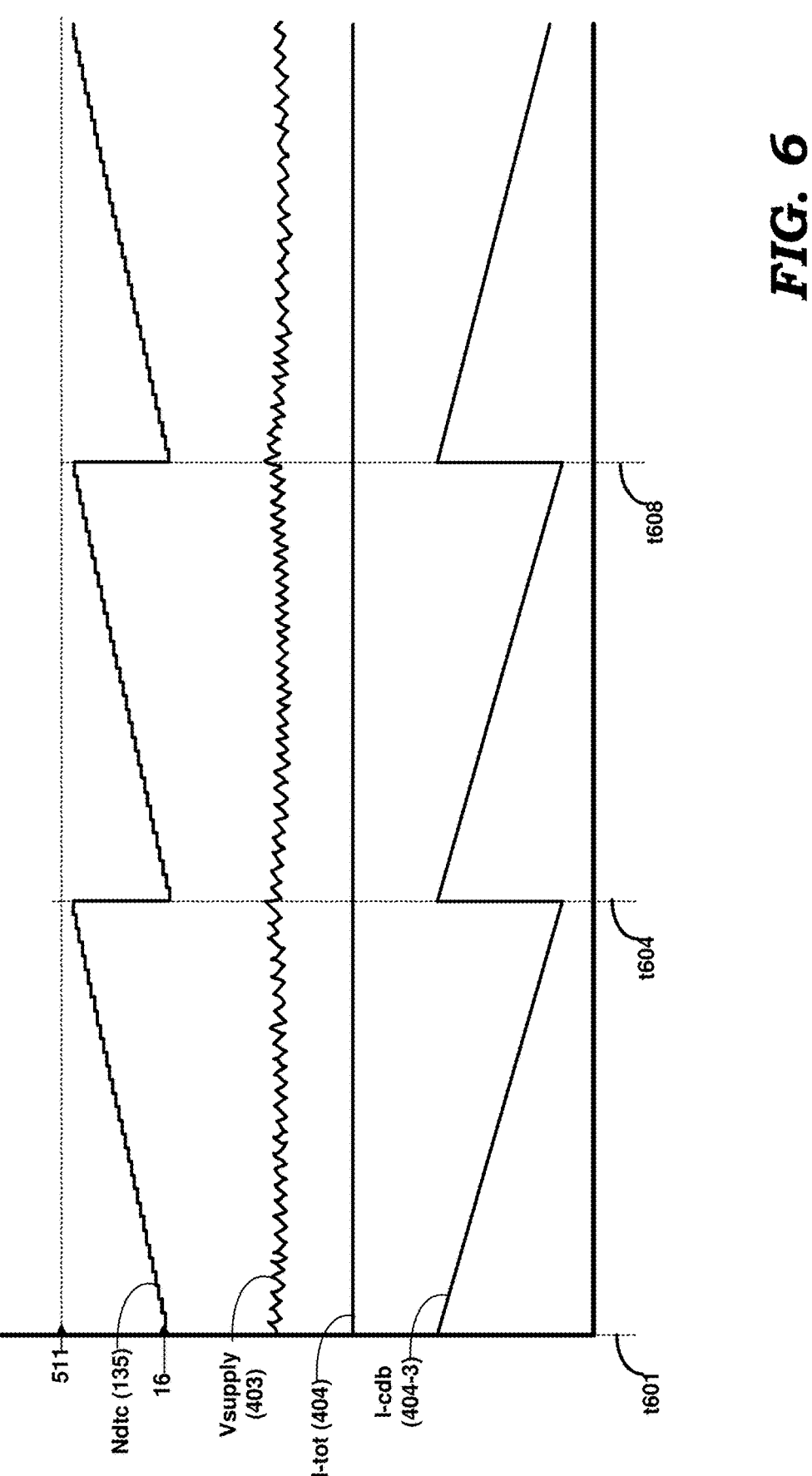
FIG. 6 is a timing diagram (not to scale) illustrating the reduction in ripple in power supply voltage, in an embodiment of the present disclosure.

FIG. 6 is a timing diagram (not to scale) illustrating reduction in ripple in power supply voltage in steady-state operation of DTC 150 in an embodiment of the present disclosure, and depicts waveforms/values Vsupply (403), Ndtc (135), I-cdb (404-3) and I-tot (404). Although the illustrative embodiment depicts DTC 150 as delaying falling edges of clock f_div (145), aspects of the present disclosure are equally applicable to DTCs delaying rising edges, as will be apparent to a skilled practitioner by reading the disclosure herein.

Current I-cdb (404-3) drawn from LDO 420 by CDB 490 is shown to be inversely related to code Ndtc (135). Thus, in time intervals t601-t604 and t604-t608, when magnitude of Ndtc (135) is increasing, current I-cdb (404-3) drawn by CDB 490 is shown to be decreasing. As noted above, current, I-tot (404), drawn from LDO 420 remains substantially constant regardless of magnitude of Ndtc (135), although a high-frequency ripple may be still present.

Specifically, the magnitude of total current drawn from LDO 420 by delay generator 460 and CDB 490 equals an aggregate of:

A. Magnitude of correction-current (I-cdb 404-3) plus magnitude of variable component of current drawn by delay generator 460; and B. Magnitude of fixed component drawn by symmetric inverter and offset-capacitor (if present) in asymmetric inverter.

Expressed in terms of fixed and variable components, the magnitude of total current drawn from LDO 420 by delay generator 460 and CDB 490 contains:

(A) A fixed component consisting of currents drawn by symmetric inverter and offset-capacitor in asymmetric inverter; and (B) A variable component consisting of:

(i) Current drawn due to operation of variable capacitor bank (excluding offset-capacitor, which is accounted for in the fixed component) in asymmetric inverter, the magnitude of which is determined only by magnitude of Ndtc code (135); and (ii) Current drawn by CDB 490, the magnitude of which is determined only by magnitude of Mcdb code (456).

It may be appreciated that complementing the variable component to ensure a fixed amount of current is drawn from power supply leads to reduction/avoidance of the ripple. The technique also results in reduced power consumption as compared to prior technique depicted in FIG. 3D. Specifically, the additional current represented by fixed component (A) (ii) of current drawn in the prior solution of FIG. 3D is not incurred, according to aspects of the present disclosure. Additionally, usage of DAC may reduce the area overhead associated at least with usage of replica capacitor bank in prior DTC 350'.

It is noted herein that although waveform I-tot (404), representing current drawn from LDO 420, is shown as straight line for ease of illustration, it is understood that, in practice, a non-zero difference between currents drawn for unequal codes Ndtc (135) may still exist, although such difference is minimized as compared to difference indicated for prior art. Such non-zero difference may depend on factors such as bandwidth of LDO 420, operating frequency range of f_frac (155), fraction being realized, etc.

Since there is no (or very little) difference in magnitude of Vsupply (403) for processing edge transitions of f_div (145) by delay control block 480, regardless of magnitudes of Ndtc (135), delays realized by delay control block 480 in edges of interest of f_div (145) are substantially close to the ideal delays, thus improving linearity in DTC 150.

In addition to employing CDB 490, in an embodiment, the capacitance value of decoupling capacitor (412) is selected to be as large as practically possible, i.e., within area constraints specified for the chip. For example, decoupling capacitor (412) may have a capacitance value range of 20-40 pico-Farads to partly reduce the non-linearity caused due to ripple in Vsupply (403) for an OLM configured to operate at fref clock frequency range of 200-1400 Mega-Hertz.

In this manner, aspects of the present disclosure reduce non-linearity in a DTC caused due to unequal successive input codes specifying respective delays. DTC 150 implemented as described above can be incorporated in a larger device or system as described briefly next.

8. System

Figure 7:
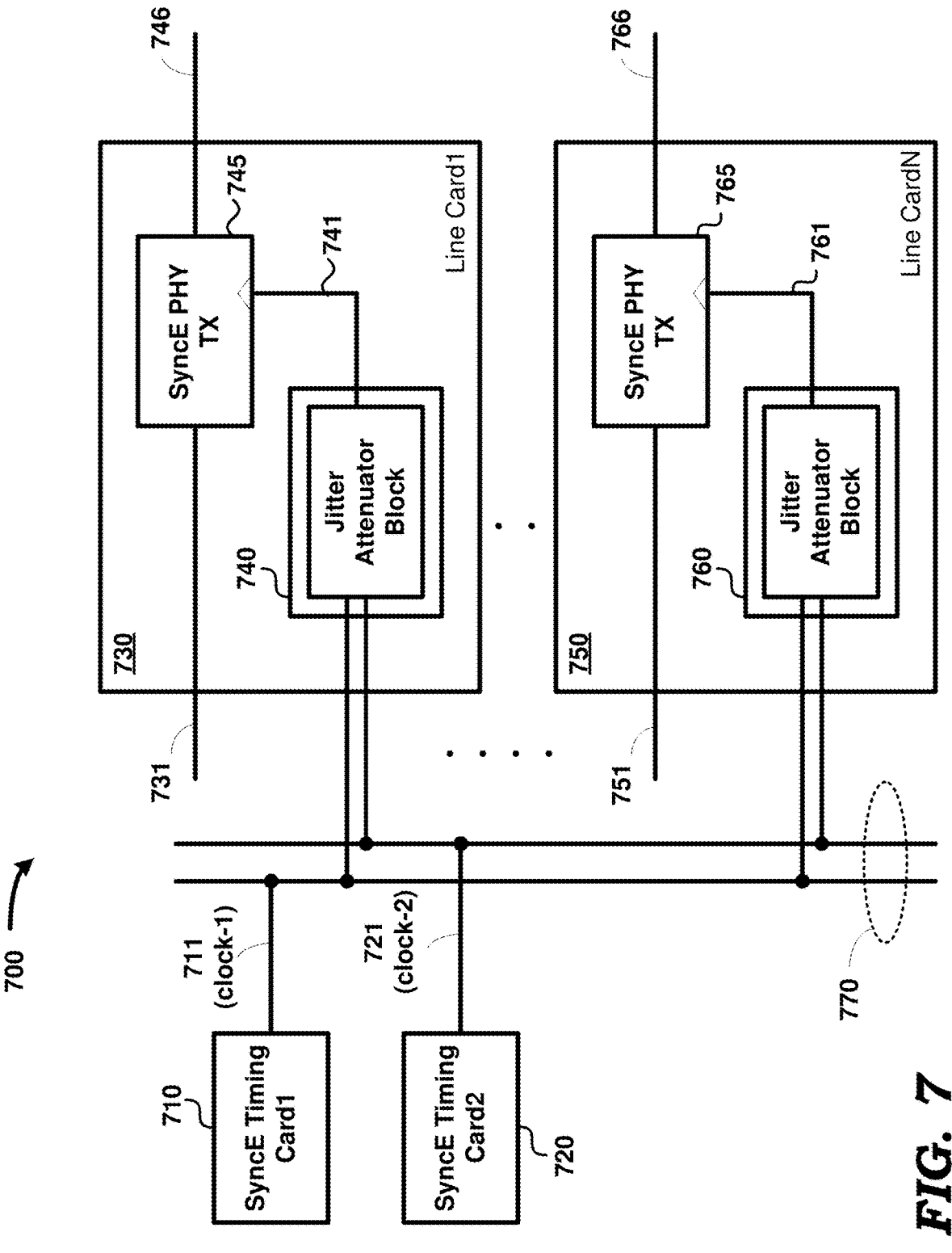
FIG. 7 is a block diagram of a system incorporating a device implemented according to several aspects of the present disclosure, in an embodiment of the present disclosure.

FIG. 7 is a block diagram of an example system containing a PLL implemented according to various aspects of the present disclosure, as described in detail above. System 700 is shown containing SyncE (Synchronous Ethernet) timing cards (710 and 720) and line cards 1 through N, of which only two line cards 730 and 750 are shown for simplicity. Line card 730 is shown containing jitter attenuator block 740 and SyncE PHY Transmitter 745. Line card 750 is shown containing jitter attenuator block 760 and SyncE PHY Transmitter 765. The components of FIG. 7 may operate consistent with the Synchronous Ethernet (SyncE) network standard. As is well known in the relevant arts, SyncE is a physical layer (PHY)-based technology for achieving synchronization in packet-based Ethernet networks. The SyncE clock signal transmitted over the physical layer should be traceable to an external master clock (for example, from a timing card such as card 710 or 720). Accordingly, Ethernet packets are re-timed with respect to the master clock, and then transmitted in the physical layer. Thus, data packets (e.g., on path 731 and 751) are re-timed and transmitted without any time stamp information being recorded in the data packet. The packets may be generated by corresponding applications such as IPTV (Internet Protocol Television), VOIP (Voice over Internet Protocol), etc.

Thus, line card 730 receives a packet on path 731, and forwards the packet on output 746 after the packet has been re-timed (synchronized) with a master clock. Similarly, line card 750 receives a packet on path 751, and forwards the packet on output 766 after the packet has been re-timed (synchronized) with a master clock.

The master clock (711/clock 1) is generated by timing card 710. Timing card 720 generates a redundant clock (721/clock-2) that is to be used by line cards 730 and 750 upon failure of master clock 711. Master clock 711 and redundant clock 721 are provided via a backplane (represented by numeral 770) to each of lines cards 730 and 750.

In line card 730, jitter attenuator block 740 contains PLL 110 and OLM 100 (of FIG. 1) described above in detail, and receives clocks 711 and 721. PLL 740 generates an output clock 741 which is used to synchronize (re-time) packets received on path 731 and forwarded as re-timed packets on path 746.

Similarly, in line card 750, jitter attenuator block 760 also contains PLL 110 and OLM 100 (of FIG. 1) described above in detail, and receives clocks 711 and 721. PLL 760 generates an output clock 761 which is used to synchronize (re-time) packets received on path 751 and forwarded as re-timed packets on path 766.

9. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 3A, 3B, 3D, 4, 5 and 7, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

In the instant application, the power and ground terminals are referred to as constant reference potentials.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. An open-loop modulator (OLM) circuit for generating a fractional output clock having a frequency which is a desired fraction of that of a reference clock, wherein said desired fraction comprises an integer component and a fractional component, said OLM comprising:
    a delta-sigma modulator (DSM) coupled to receive said desired fraction and to generate a sequence of first codes and a corresponding sequence of second codes, wherein said sequence of first codes comprises a set of a lower value and a set of a higher value together representing said desired fraction on average;
    a first divider coupled to receive said reference clock and each first code of said sequence of first codes, and to generate a divided signal having a period that is a multiple of the period of said reference clock, wherein the multiple is said each first code;
    a digital-to-time converter (DTC) coupled to generate said fractional output clock from said divided signal, wherein said DTC comprises:
        a delay generator, powered by a power supply, coupled to receive said divided signal and to delay an edge of interest of said divided signal according to corresponding second code of said sequence of second codes to generate said fractional output clock, wherein the current drawn by said delay generator from said power supply comprises:
            a fixed component having a first current magnitude regardless of magnitude of said corresponding second code; and
            a variable component having a magnitude determined only by magnitude of corresponding second code of said sequence of second codes,

a current-drawing block coupled to draw a correction-current from said power supply, wherein a magnitude of said correction-current is determined only by a complement of the corresponding second code of said sequence of second codes,
        wherein said current-drawing block operates to ensure that a sum of said correction-current and said variable component drawn by said delay generator is constant regardless of magnitude of said corresponding second code,
        wherein total current drawn from said power supply by said delay generator and said current-drawing block equals an aggregate of said sum and said fixed component.

2. The OLM circuit of claim 1, wherein said current-drawing block is a current digital-to-analog converter (DAC) which receives said complement as input and draws said correction-current to convert said complement to current.

3. The OLM circuit of claim 2, wherein said DTC comprises:
    an input buffer coupled to receive said divided signal and to generate a buffered signal, wherein said buffered signal is provided to said delay generator; and
    an output buffer coupled to receive said fractional output clock and to generate a buffered fractional output clock,
    wherein said delay generator comprises:
        an asymmetric inverter drawing said variable component; and
        a symmetric inverter drawing at least a part of said fixed component.

4. The OLM circuit of claim 2, wherein said DSM is a first-order delta-sigma modulator.

5. The OLM circuit of claim 4, wherein said complement of said second code comprises a plurality of bits, wherein magnitude of said correction-current is proportional to a magnitude of a subset of bits of said plurality of bits,
    wherein said subset of bits comprises a pre-determined number of most-significant bits (MSBs) of said plurality of bits.

6. The OLM circuit of claim 5, wherein said current DAC comprises:
    a programmable current source operable to source a reference current from a bias voltage-source, wherein a first terminal of said programmable current source is coupled to said bias voltage-source;
    a first transistor, wherein a first current terminal of said first transistor is coupled to a control terminal of said first transistor, wherein a second current terminal of said first transistor is coupled to a constant reference potential, wherein a second terminal of said programmable current source is coupled to said first current terminal of said first transistor;
    a plurality of switches;
    a plurality of transistors having control terminals coupled together and to said control terminal of said first transistor, wherein a first current terminal of each transistor of said a plurality of transistors is coupled to said power supply via a respective switch of said plurality of switches, wherein a second current terminal of each transistor of said a plurality of transistors is coupled to said constant reference potential,
    wherein each switch operates, when closed to connect to, and when open to disconnect from, said power supply a respective transistor of said plurality of transistors;
    wherein each switch is operable to be closed or open by a corresponding bit of said subset of bits, wherein said plurality of transistors is operable to sink said correction-current.

7. The OLM circuit of claim 6, further comprising a look-up table containing corresponding values of said reference current for each range of a respective operating frequency range of said fractional output clock, wherein a magnitude of said reference current is configured based on said look-up table.

8. A digital-to-time converter (DTC) for generating a fractional output clock from a divided signal based on a sequence of delay-codes, said DTC comprising:

a delay generator, powered by a power supply, coupled to receive said divided signal and to delay an edge of interest of said divided signal according to each delay-code of said sequence of delay-codes to generate said fractional output clock, wherein the current drawn by said delay generator from said power supply comprises:

a fixed component having a first current magnitude regardless of magnitude of said corresponding delay-code; and a variable component having a magnitude determined only by magnitude of corresponding delay-code of said sequence of delay-codes, a current-drawing block coupled to draw a correction-current from said power supply, wherein a magnitude of said correction-current is determined only by a complement of the corresponding delay-code of said sequence of delay-codes, wherein said current-drawing block operates to ensure that a sum of said correction-current and said variable component drawn by said delay generator is constant regardless of magnitude of said corresponding delay-code, wherein total current drawn from said power supply by said delay generator and said current-drawing block equals an aggregate of said sum and said fixed component.

9. The DTC of claim 8, wherein said current-drawing block is a current digital-to-analog converter (DAC) which receives said complement as input and draws said correction-current to convert said complement to current.

10. The DTC of claim 9, wherein said DTC comprises:

an input buffer coupled to receive said divided signal and to generate a buffered signal, wherein said buffered signal is provided to said delay generator; and an output buffer coupled to receive said fractional output clock and to generate a buffered fractional output clock, wherein said delay generator comprises:

an asymmetric inverter drawing said variable component; and a symmetric inverter drawing at least a part of said fixed component.

11. The DTC of claim 10, wherein said complement of said delay-code comprises a plurality of bits, wherein magnitude of said correction-current is proportional to a magnitude of a subset of bits of said plurality of bits, wherein said subset of bits comprises a pre-determined number of most-significant bits (MSBs) of said plurality of bits.

12. The DTC of claim 11, wherein said current DAC comprises:

a programmable current source operable to source a reference current from a bias voltage-source, wherein a first terminal of said programmable current source is coupled to said bias voltage-source;

a first transistor, wherein a first current terminal of said first transistor is coupled to a control terminal of said first transistor, wherein a second current terminal of said first transistor is coupled to a constant reference potential, wherein a second terminal of said programmable current source is coupled to said first current terminal of said first transistor;

a plurality of switches;

a plurality of transistors having control terminals coupled together and to said control terminal of said first transistor, wherein a first current terminal of each transistor of said a plurality of transistors is coupled to said power supply via a respective switch of said plurality of switches, wherein a second current terminal of each transistor of said a plurality of transistors is coupled to said constant reference potential, wherein each switch operates, when closed to connect to, and when open to disconnect from, said power supply a respective transistor of said plurality of transistors;

wherein each switch is operable to be closed or open by a corresponding bit of said subset of bits, wherein said plurality of transistors is operable to sink said correction-current.

13. The DTC of claim 12, wherein said DTC is designed to operate for a plurality of operating frequency ranges of said fractional output clock, wherein said DTC comprises a look-up table containing corresponding values of said reference current for each operating frequency range of said plurality of operating frequency ranges, wherein a magnitude of said reference current is configured based on said look-up table.

14. A system comprising:

a line card coupled to receive a data packet, said line card to re-time said data packet with reference to a selected clock, and to transmit a re-timed packet;

a first timing card to generate a first clock; and a power supply, wherein said line card comprises:

a phase-locked loop (PLL) coupled to receive said first clock, said PLL to generate a reference clock locked to said first clock; and an open-loop-modulator (OLM) coupled to receive said reference clock and to generate a fractional output clock having a frequency which is a desired fraction of that of said reference clock, wherein said OLM comprises:

a delta-sigma modulator (DSM) coupled to receive said desired fraction and to generate a sequence of first codes and a corresponding sequence of second codes, wherein said sequence of first codes comprises a set of a lower value and a set of a higher value together representing said desired fraction on average;

a first divider coupled to receive said reference clock and each first code of said sequence of first codes, and to generate a divided signal having a period that is a multiple of the period of said reference clock, wherein the multiple is said each first code;

a digital-to-time converter (DTC) coupled to generate said fractional output clock from said divided signal, wherein said DTC comprises:

a delay generator, powered by a power supply, coupled to receive said divided signal and to delay an edge of interest of said divided signal according to corresponding second code of said sequence of second codes to generate said fractional output clock, wherein the current drawn by said delay generator from said power supply comprises:

a fixed component having a first current magnitude regardless of magnitude of said corresponding second code; and a variable component having a magnitude determined only by magnitude of corresponding second code of said sequence of second codes, a current-drawing block coupled to draw a correction-current from said power supply, wherein a magnitude of said correction-current is determined only by a complement of the corresponding second code of said sequence of second codes, wherein said current-drawing block operates to ensure that a sum of said correction-current and said variable component drawn by said delay generator is constant regardless of magnitude of said corresponding second code, wherein total current drawn from said power supply by said delay generator and said current-drawing block equals an aggregate of said sum and said fixed component.

15. The system of claim 14, wherein said current-drawing block is a current digital-to-analog converter (DAC) which receives said complement as input and draws said correction-current to convert said complement to current.

16. The system of claim 15, wherein said DTC comprises:

an input buffer coupled to receive said divided signal and to generate a buffered signal, wherein said buffered signal is provided to said delay generator; and an output buffer coupled to receive said fractional output clock and to generate a buffered output clock, wherein said delay generator comprises:

an asymmetric inverter drawing said variable component; and a symmetric inverter drawing at least a part of said fixed component.

17. The system of claim 15, wherein said DSM is a first-order delta-sigma modulator.

18. The system of claim 17, wherein said complement of said second code comprises a plurality of bits, wherein magnitude of said correction-current is proportional to a magnitude of a subset of bits of said plurality of bits, wherein said subset of bits comprises a pre-determined number of most-significant bits (MSBs) of said plurality of bits.

19. The system of claim 18, wherein said current DAC comprises:

a programmable current source operable to source a reference current from a bias voltage-source, wherein a first terminal of said programmable current source is coupled to said bias voltage-source;

a first transistor, wherein a first current terminal of said first transistor is coupled to a control terminal of said first transistor, wherein a second current terminal of said first transistor is coupled to a constant reference potential, wherein a second terminal of said programmable current source is coupled to said first current terminal of said first transistor;

a plurality of switches;

a plurality of transistors having control terminals coupled together and to said control terminal of said first transistor, wherein a first current terminal of each transistor of said a plurality of transistors is coupled to said power supply via a respective switch of said plurality of switches, wherein a second current terminal of each transistor of said a plurality of transistors is coupled to said constant reference potential, wherein each switch operates, when closed to connect to, and when open to disconnect from, said power supply a respective transistor of said plurality of transistors;

wherein each switch is operable to be closed or open by a corresponding bit of said subset of bits, wherein said plurality of transistors is operable to sink said correction-current.

20. The system of claim 19, further comprising a look-up table containing corresponding values of said reference current for each range of a respective operating frequency range of said fractional output clock, wherein a magnitude of said reference current is configured based on said look-up table.

* * * * *